US010349161B2

United States Patent
Opris et al.

(10) Patent No.: US 10,349,161 B2
(45) Date of Patent: Jul. 9, 2019

(54) MICROPHONE CIRCUITS FOR CANCELING OUT THE LEAKAGE CHARACTERISTICS OF A TRANSDUCER

(71) Applicant: Fortemedia, Inc., Santa Clara, CA (US)

(72) Inventors: Ion Opris, San Jose, CA (US); Abu Hena M Kamal, Santa Clara, CA (US); Ramesh Prakash, Fremont, CA (US); Lee Tay Chew, Cupertino, CA (US)

(73) Assignee: FORTEMEDIA, INC., Santa Clara, CA (US)

( * ) Notice: Subject to any disclaimer, the term of this patent is extended or adjusted under 35 U.S.C. 154(b) by 0 days.

(21) Appl. No.: 15/730,836

(22) Filed: Oct. 12, 2017

(65) Prior Publication Data

US 2018/0109869 A1    Apr. 19, 2018

Related U.S. Application Data

(60) Provisional application No. 62/409,920, filed on Oct. 19, 2016.

(51) Int. Cl.
| | | |
|---|---|---|
| *A61F 11/06* | (2006.01) | |
| *H04R 3/00* | (2006.01) | |
| *H04R 1/10* | (2006.01) | |
| *G10K 11/16* | (2006.01) | |
| *H04R 1/34* | (2006.01) | |
| *B81B 3/00* | (2006.01) | |
| *B06B 1/02* | (2006.01) | |
| *B81B 7/00* | (2006.01) | |
| *H04R 3/06* | (2006.01) | |
| *H04R 19/00* | (2006.01) | |
| *H04R 19/04* | (2006.01) | |

(52) U.S. Cl.
CPC ......... *H04R 1/1083* (2013.01); *B06B 1/0207* (2013.01); *B81B 3/0035* (2013.01); *B81B 7/008* (2013.01); *G10K 11/16* (2013.01); *H04R 1/342* (2013.01); *H04R 3/002* (2013.01); *H04R 3/06* (2013.01); *B81B 2201/0257* (2013.01); *H04R 19/005* (2013.01); *H04R 19/04* (2013.01)

(58) Field of Classification Search
CPC ........ H04R 3/00; H04R 19/04; H04R 1/1083; B06B 1/0207
USPC .................. 381/113, 71.1, 92, 122
See application file for complete search history.

(56) References Cited

U.S. PATENT DOCUMENTS

| | | | | |
|---|---|---|---|---|
| 2010/0246859 A1* | 9/2010 | David | ..................... | H02M 3/07 381/120 |
| 2015/0110295 A1* | 4/2015 | Jenkner | ..................... | H04R 1/08 381/114 |

* cited by examiner

*Primary Examiner* — Xu Mei
*Assistant Examiner* — Ammar T Hamid
(74) *Attorney, Agent, or Firm* — McClure, Qualey & Rodack, LLP

(57) ABSTRACT

A circuit for biasing a transducer including a first plate and a second plate includes a front-end buffer and a charge pump. The front-end buffer generates an internal signal at an internal node in response to a voltage signal of the second plate. The transducer receives the incident sound wave at the first plate to generate the voltage signal at the second plate. The charge pump boosts the internal signal into a boost voltage at the first plate according to a first clock signal.

22 Claims, 4 Drawing Sheets

MICROPHONE CIRCUITS FOR CANCELING OUT THE LEAKAGE CHARACTERISTICS OF A TRANSDUCER

CROSS REFERENCE TO RELATED APPLICATIONS

This application claims the benefit of U.S. Provisional Application No. 62/409,920, filed on Oct. 19, 2016, the entirety of which is incorporated by reference herein.

BACKGROUND OF THE INVENTION

Field of the Invention

The disclosure generally relates to a circuit for biasing a MEMS sensor, and more specifically relates to a charge pump based circuit generating a bias voltage across a MEMS sensor which is independent of the leakage characteristics of the MEMS sensor.

Description of the Related Art

Today's smartphones and mobile phones have number of microphones built into them. MEMS transducers have emerged with the demand of small packages microphone. MEMS transducers are used in a variety of applications including audio sensing, pressure sensing, acceleration monitoring, and ultrasonic scanning.

The leakage characteristics of the transducer, however, may impact in the bias voltage across the transducer. A circuit for biasing the MEMS transducer is needed to generate a constant bias voltage across the transducer regardless the leakage characteristics of the transducer.

BRIEF SUMMARY OF THE INVENTION

In an embodiment, a circuit for biasing a transducer comprises a first plate and a second plate. The circuit for biasing a transducer also comprises a front-end buffer and a charge pump. The front-end buffer generates an internal signal at an internal node in response to a voltage signal of the second plate. The transducer receives the incident sound wave at the first plate to generate the voltage signal at the second plate. The charge pump boosts the internal signal into a boost voltage at the first plate according to a first clock signal.

According to an embodiment of the invention, the front-end buffer comprises a bias current source and a P-type transistor. The bias current source supplies a current to the internal node. The P-type transistor comprises a gate terminal coupled to the second plate, a source terminal coupled to the internal node, and a drain coupled to a ground.

According to an embodiment of the invention, the charge pump comprises a first unidirectionally conducting device, a first capacitor, an output unidirectionally conducting device, and an output capacitor. The first unidirectionally conducting device unidirectionally provides the internal signal to the first pump node. The first capacitor is coupled between the first pump node and the first clock signal. The output unidirectionally conducting device unidirectionally provides a voltage of the first pump node to the first plate. The output capacitor is coupled between the first plate and the ground.

According to an embodiment of the invention, the first clock signal comprises a high logic level and a low logic level, wherein the boost voltage is boosted to a level that is equal to the sum of the internal signal and the high logic level minus the drop voltages across the first unidirectionally conducting device and the output unidirectionally conducting device.

According to an embodiment of the invention, each of the first unidirectionally conducting device and the output unidirectionally conducting device is a diode.

According to another embodiment of the invention, each of the first unidirectionally conducting device and the output unidirectionally conducting device is a diode-connected transistor.

According to an embodiment of the invention, the charge pump further comprises a second unidirectionally conducting device and a second capacitor. The second unidirectionally conducting device is coupled between the first pump node and the output unidirectionally conducting device and unidirectionally couples the first pump node to a second pump node. The output unidirectionally conducting device is coupled between the second pump node and the first plate. The second capacitor is coupled between the second pump node and a second clock signal which is an inverse of the first clock signal.

According to an embodiment of the invention, the second unidirectionally conducting device is a diode.

According to another embodiment of the invention, second unidirectionally conducting device is a diode-connected transistor.

According to an embodiment of the invention, the transducer comprises a leakage current source, a variable capacitor, and a fixed capacitor, and a bias resistor. The leakage current source comprises a leakage current flowing from the first plate to the second plate, which is time-variant and is a constant after a period from startup. The variable capacitor is coupled between the first plate and the second plate and comprising a capacitance which is varied in response to the incident sound wave. The fixed capacitor is coupled between the first plate and the second plate. The bias resistor is coupled between the second plate and a ground.

According to an embodiment of the invention, the circuit further comprises a switch. The switch is coupled between the second plate and the ground and controlled by a power-on-reset signal. When the circuit is powered ON and the switch pulls a voltage of the second plate to the ground, the leakage current and the bias resistor generates a leakage voltage at the second plate. The charge pump boosts the leakage voltage into the boost voltage at the first plate, such that the voltage across the transducer is not related to the leakage voltage.

According to an embodiment of the invention, the circuit further comprises a low-noise amplifier and an analog-to-digital converter. The low-noise amplifier amplifies the internal signal to generate an audio signal. The analog-to-digital converter converts the audio signal into a digital signal.

In an embodiment, a microphone circuit comprises a transducer, a front-end buffer, and a charge pump. The transducer comprises a first plate and a second plate, which receives an incident sound wave at the first plate to generate a voltage signal at the second plate. The front-end buffer generates an internal signal at an internal node in response to the voltage signal. The charge pump boosts the internal signal into a boost voltage at the first plate according to a first clock signal.

According to an embodiment of the invention, the front-end buffer comprises a bias current source and a P-type transistor. The bias current source supplies a current to the internal node. The P-type transistor comprises a gate terminal coupled to the second plate, a source terminal coupled to the internal node, and a drain coupled to a ground.

According to an embodiment of the invention, the charge pump comprises a first unidirectionally conducting device, a first capacitor, an output unidirectionally conducting device, and an output capacitor. The first unidirectionally conducting device unidirectionally provides the internal signal to the first pump node. The first capacitor is coupled between the first pump node and the first clock signal. The output unidirectionally conducting device unidirectionally provides a voltage of the first pump node to the first plate. The output capacitor is coupled between the first plate and the ground.

According to an embodiment of the invention, the first clock signal comprises a high logic level and a low logic level, wherein the boost voltage is boosted to a level that is equal to the sum of the internal signal and the high logic level minus the drop voltages across the first unidirectionally conducting device and the output unidirectionally conducting device.

According to an embodiment of the invention, each of the first unidirectionally conducting device and the output unidirectionally conducting device is a diode.

According to another embodiment of the invention, each of the first unidirectionally conducting device and the output unidirectionally conducting device is a diode-connected transistor.

According to an embodiment of the invention, the charge pump further comprises a second unidirectionally conducting device and a second capacitor. The second unidirectionally conducting device is coupled between the first pump node and the output unidirectionally conducting device and unidirectionally couples the first pump node to a second pump node. The output unidirectionally conducting device is coupled between the second pump node and the first plate. The second capacitor is coupled between the second pump node and a second clock signal which is an inverse of the first clock signal.

According to an embodiment of the invention, the second unidirectionally conducting device is a diode.

According to another embodiment of the invention, second unidirectionally conducting device is a diode-connected transistor.

According to an embodiment of the invention, the transducer comprises a leakage current source, a variable capacitor, a fixed capacitor, and a bias resistor. The leakage current source comprises a leakage current flowing from the first plate to the second plate, which is time-variant and is a constant after a period from startup. The variable capacitor is coupled between the first plate and the second plate and comprising a capacitance which is varied in response to the incident sound wave. The fixed capacitor is coupled between the first plate and the second plate. The bias resistor leaks a leakage current from the second plate to a ground.

According to an embodiment of the invention, the microphone circuit further comprises a switch. The switch is coupled between the second plate and the ground and controlled by a power-on-reset signal. When the circuit is powered ON and the switch pulls a voltage of the second plate to the ground, the leakage current and the bias resistor generates a leakage voltage at the second plate. The charge pump boosts the leakage voltage into the boost voltage at the first plate, such that the voltage across the transducer is not related to the leakage voltage.

According to an embodiment of the invention, the microphone circuit further comprises a low-noise amplifier and an analog-to-digital converter. The low-noise amplifier amplifies the internal signal to generate an audio signal. The analog-to-digital converter converts the audio signal into a digital signal.

A detailed description is given in the following embodiments with reference to the accompanying drawings.

BRIEF DESCRIPTION OF DRAWINGS

The invention can be more fully understood by reading the subsequent detailed description and examples with references made to the accompanying drawings, wherein.

DETAILED DESCRIPTION OF THE INVENTION

Figure 1:
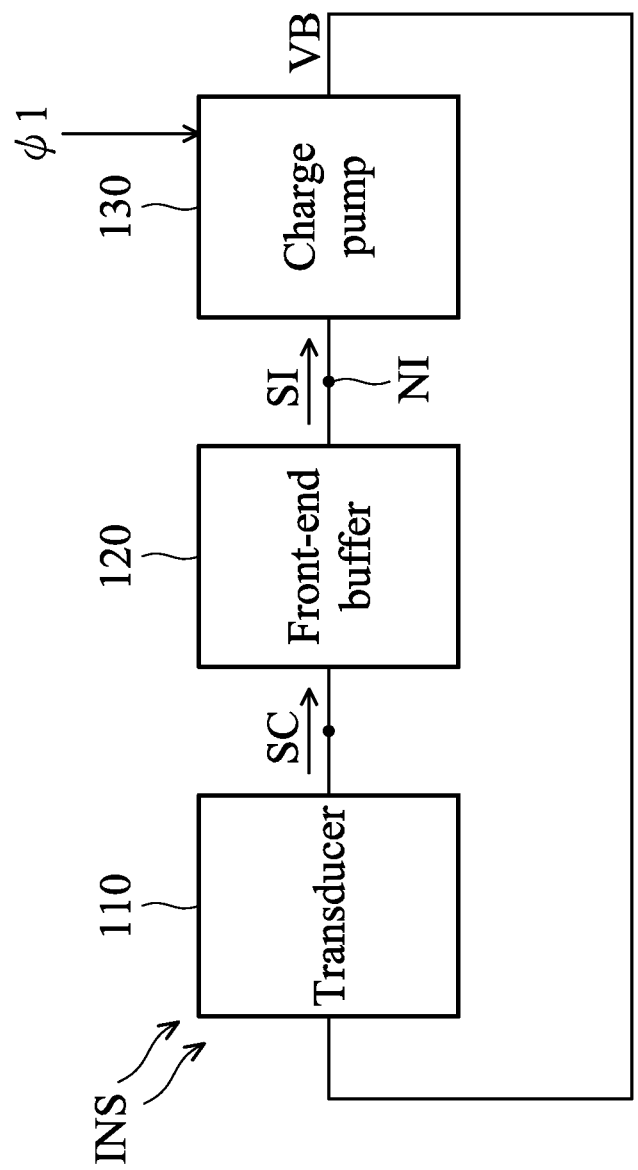
FIG. 1 is a block diagram of a microphone circuit in accordance with an embodiment of the invention.

This description is made for the purpose of illustrating the general principles of the invention and should not be taken in a limiting sense. In addition, the present disclosure may repeat reference numerals and/or letters in the various examples. This repetition is for the purpose of simplicity and clarity and does not in itself dictate a relationship between the various embodiments and/or configurations discussed. The scope of the invention is best determined by reference to the appended claims.

It should be understood that the following disclosure provides many different embodiments, or examples, for implementing different features of the application. Specific examples of components and arrangements are described below to simplify the present disclosure. These are, of course, merely examples and are not intended to be limiting. In addition, the present disclosure may repeat reference numerals and/or letters in the various examples. This repetition is for the purpose of simplicity and clarity and does not in itself dictate a relationship between the various embodiments and/or configurations discussed. Moreover, the formation of a feature on, connected to, and/or coupled to another feature in the present disclosure that follows may include embodiments in which the features are formed in direct contact, and may also include embodiments in which additional features may be formed interposing the features, such that the features may not be in direct contact.

FIG. 1 is a block diagram of a microphone circuit in accordance with an embodiment of the invention. As shown in FIG. 1, the microphone circuit 100 includes the transducer 110, the front-end buffer 120, and the charge pump 130. The transducer 110 receives the incident sound wave INS to generate a voltage signal SC. According to an embodiment of the invention, the transducer may be a MEMS transducer. According to other embodiments of the invention, the transducer may be any transducer which is known or unknown.

The front-end buffer 120 generates an internal signal SI at an internal node NI, in response to the voltage signal SC. The charge pump 130 boosts the internal signal SI into a boost voltage VB, according to a first clock signal φ1. According to an embodiment of the invention, when the voltage signal SC indicates the leakage characteristics of the transducer 110, the boost voltage VB also includes the leakage characteristics of the transducer 110.

Since the leakage characteristics appear at both plates of the transducer 110, the leakage characteristics may be canceled out in the voltage across the transducer 110. How to cancel the leakage characteristics will be precisely described in the following paragraphs.

Figure 2:
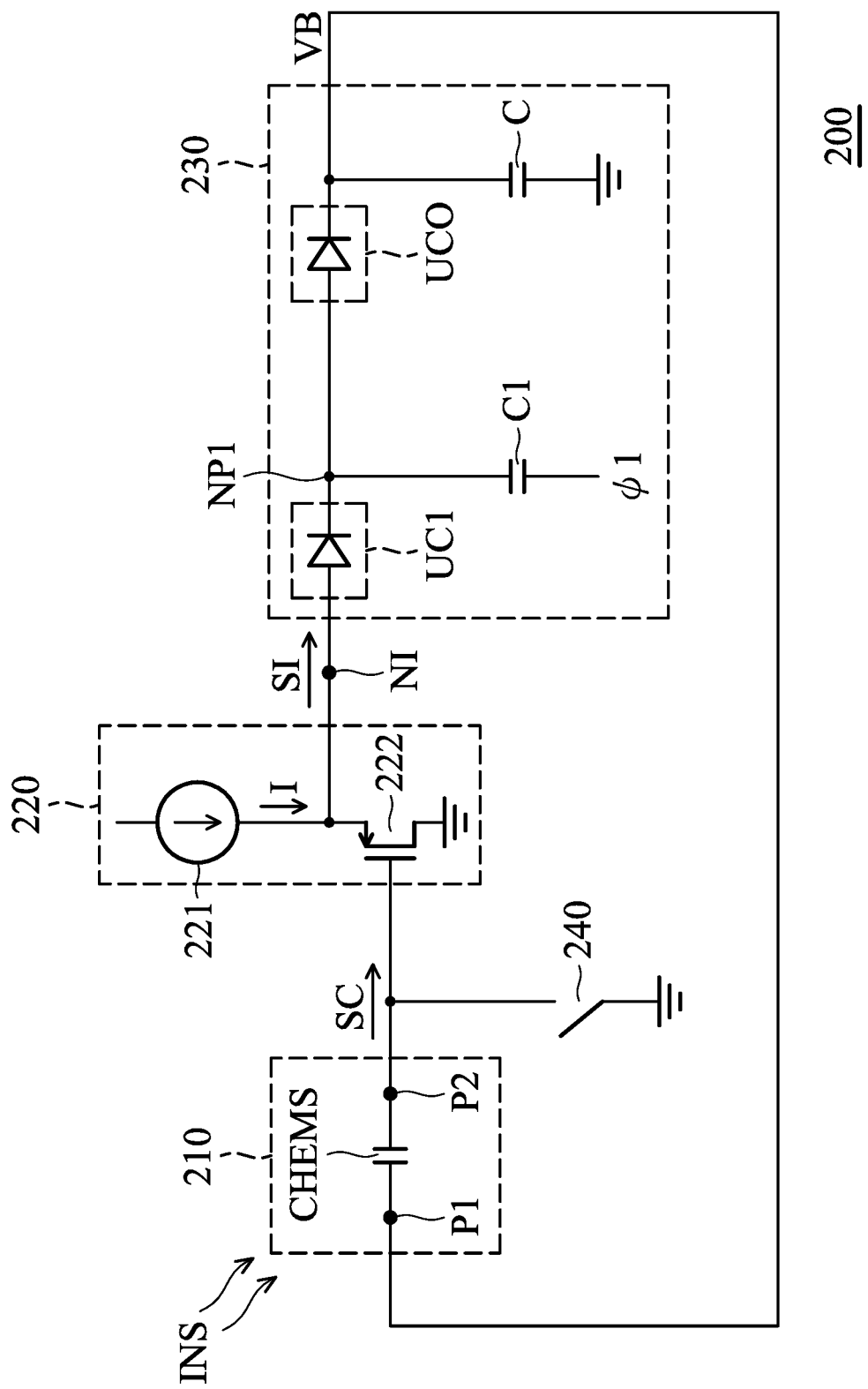
FIG. 2 is a schematic diagram of a microphone circuit in accordance with an embodiment of the invention.

FIG. 2 is a schematic diagram of a microphone circuit in accordance with an embodiment of the invention. As shown in FIG. 2, the microphone circuit 200 includes a transducer 210, a front-end buffer 220, a charge pump 230, and a switch 240, in which the transducer 210, the front-end buffer 220, and the charge pump 230 correspond to the transducer 110, the front-end buffer 120, and the charge pump 130 in FIG. 1.

The transducer 210, which is modeled as a MEMS capacitor CMEMS, includes a first plate P1 and a second plate P2. The transducer 210 receives the incident sound wave INS at the first plate P1 to generate the voltage signal SC at the second plate P2. In response to incident sound wave INS received at the first plate P1, the flexible membrane of the transducer 210 is deformed slightly from its equilibrium position.

The change of the distance between the first plate P1 and the second plate P2 causes a change in the MEMS capacitor CMEMS. Thus, when the capacitance of the MEMS capacitor CMEMS is changed, the voltage change $\Delta V$, which defines the sensitivity of the transducer 210, can be represented by equation 1, in which $\Delta C$ indicates the capacitance change of the transducer 210.

$$\Delta V = (VB - SC) * (\Delta C / CMEMS) \quad \text{Eq. 1}$$

The front-end buffer 220 includes a bias current source 221 and a P-type transistor 222. The bias current source 221 supplies a current I to the internal node NI. The gate terminal of the P-type transistor 222 is coupled to the second plate P2 to receive the voltage signal SC, the source terminal of the P-type transistor 222 sinks the current I, and the drain terminal of the P-type transistor 222 is coupled to the ground. According to an embodiment of the invention, the P-type transistor 222 acts as a source follower such that there is only a difference of a source-to-gate voltage of the P-type transistor 222 between the internal signal SI and the voltage signal SC. In other words, the internal signal SI is a sum of the source-to-gate voltage of the P-type transistor 222 and the voltage signal SC.

The charge pump 230 includes a first unidirectionally conducting device UC1, a first capacitor C1, an output unidirectionally conducting device UCO, and an output capacitor C. The first unidirectionally conducting device UC1 unidirectionally provides the internal signal SI to the first pump node NP1. The switch 240 is configured to reset the voltage signal SC at the second plate P2.

The first capacitor C1 is coupled between the first pump node NP1 and the first clock signal $\phi 1$. The output unidirectionally conducting device UCO unidirectionally provides a voltage of the first pump node NP1 to the first plate P1. The output capacitor C is coupled between the first plate P1 and the ground.

According to an embodiment of the invention, the first clock signal $\phi 1$ includes a high logic level and a low logic level equal to the ground, in which the boost voltage VB is boosted to a level that is equal to the sum of the internal signal SI and the high logic level minus the drop voltages of the first unidirectionally conducting device UC1 and the output unidirectionally conducting device UCO.

Since the voltage of the first plate P1 is biased by the boost voltage VB, which is equal to the sum of the internal signal SI and the high logic level minus the drop voltages across the unidirectionally conducting devices, and the voltage of the second plate P2 is at the voltage signal SC, the voltage signal SC can be canceled out in the voltage across the transducer 210.

According to an embodiment of the invention, each of the first unidirectionally conducting device UC1 and the output unidirectionally conducting device UCO is a diode. According to another embodiment of the invention, each of the first unidirectionally conducting device UC1 and the output unidirectionally conducting device UCO is a transistor connected as a diode, in which the transistor can be an N-type transistor or a P-type transistor.

Figure 3:
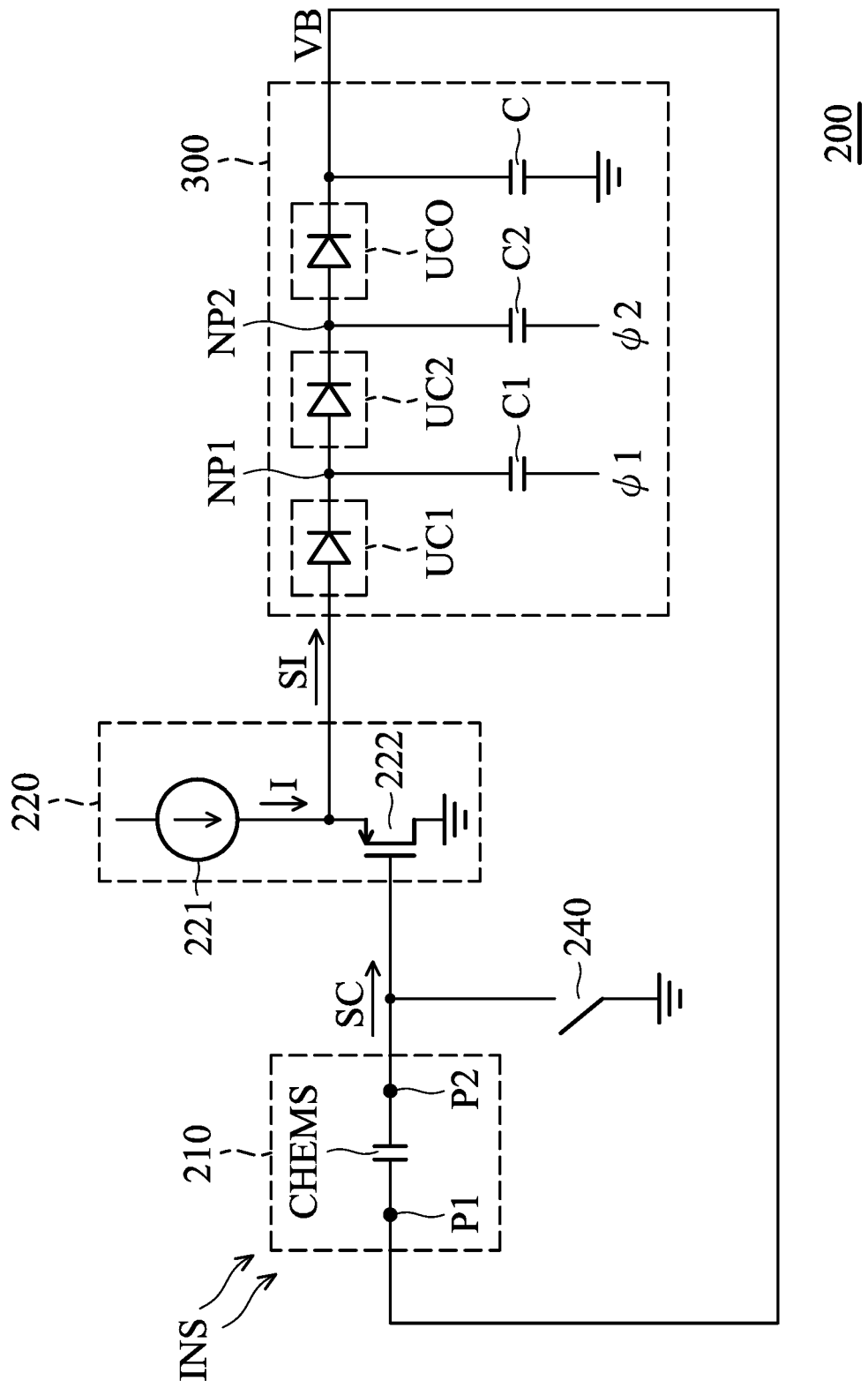
FIG. 3 is a schematic diagram of a microphone circuit in accordance with another embodiment of the invention.

FIG. 3 is a schematic diagram of a microphone circuit in accordance with another embodiment of the invention. Compared FIG. 3 with FIG. 2, the charge pump 230 in FIG. 2 has been replaced with the charge pump 300. As shown FIG. 3, the charge pump 300 includes a first unidirectionally conducting device UC1, a first capacitor C1, a second unidirectionally conducting device UC2, a second capacitor C2, an output unidirectionally conducting device UCO, and an output capacitor C.

The first unidirectionally conducting device UC1 unidirectionally provides the internal signal SI to the first pump node NP1. The first capacitor C1 is coupled between the first pump node NP1 and the first clock signal $\phi 1$.

The second unidirectionally conducting device UC2 unidirectionally provides the voltage of the first pump node NP1 to the second pump node NP2. The second capacitor C2 is coupled between the second pump node NP2 and the second clock signal $\phi 2$, in which the second clock signal $\phi 2$ is an inverse of the first clock signal $\phi 1$.

The output unidirectionally conducting device UCO unidirectionally provides a voltage of the first pump node NP1 to the first plate P1. The output capacitor C is coupled between the first plate P1 and the ground.

According to an embodiment of the invention, the first clock signal $\phi 1$ includes a high logic level and a low logic level equal to the ground, and the second clock signal $\phi 2$ includes a high logic level and a low logic level equal to the ground. The boost voltage VB is thus boosted to a level that is equal to the sum of the internal signal SI and 2-fold of the high logic level minus the drop voltages of the first unidirectionally conducting device UC1, the second unidirectionally conducting device UC2, and the output unidirectionally conducting device UCO.

Since the voltage of the first plate P1 is biased by the boost voltage VB, which is equal to the sum of the internal signal SI and 2-fold of the high logic level minus the drop voltages of the first unidirectionally conducting device UC1, the second unidirectionally conducting device UC2, and the output unidirectionally conducting device UCO, and the voltage of the second plate P2 is biased by the voltage signal SC, the voltage across the transducer 210 is independent of the voltage signal SC.

According to an embodiment of the invention, each of the first unidirectionally conducting device UC1, the second unidirectionally conducting device UC2, and the output unidirectionally conducting device UCO is a diode. According to another embodiment of the invention, each of the first unidirectionally conducting device UC1, the second unidirectionally conducting device UC2, and the output unidirectionally conducting device UCO is a transistor connected as a diode, in which the transistor can be an N-type transistor or a P-type transistor.

According to an embodiment of the invention, the first clock signal $\phi 1$ and the second clock signal $\phi 2$ may have different high logic levels. One unidirectionally conducting device (i.e., the first unidirectionally conducting device UC1 or the second unidirectionally conducting device UC2) and one capacitor (i.e., the first capacitor C1 or the second capacitor C2) are considered as a stage.

According to other embodiments of the invention, any number of stages could be cascaded before the output unidirectionally conducting device UCO to achieve a higher boost voltage VB. For example, when another stage (not shown in FIG. 3) is coupled between the second unidirectionally conducting device UC2 and the output unidirectionally conducting device UCO, the capacitor of the other stage is coupled to the first clock signal φ1. When yet another stage (not shown in FIG. 3) is coupled between the other stage and the output unidirectionally conducting device UCO, the capacitor of the yet another stage is coupled to the second clock signal φ2.

Figure 4:
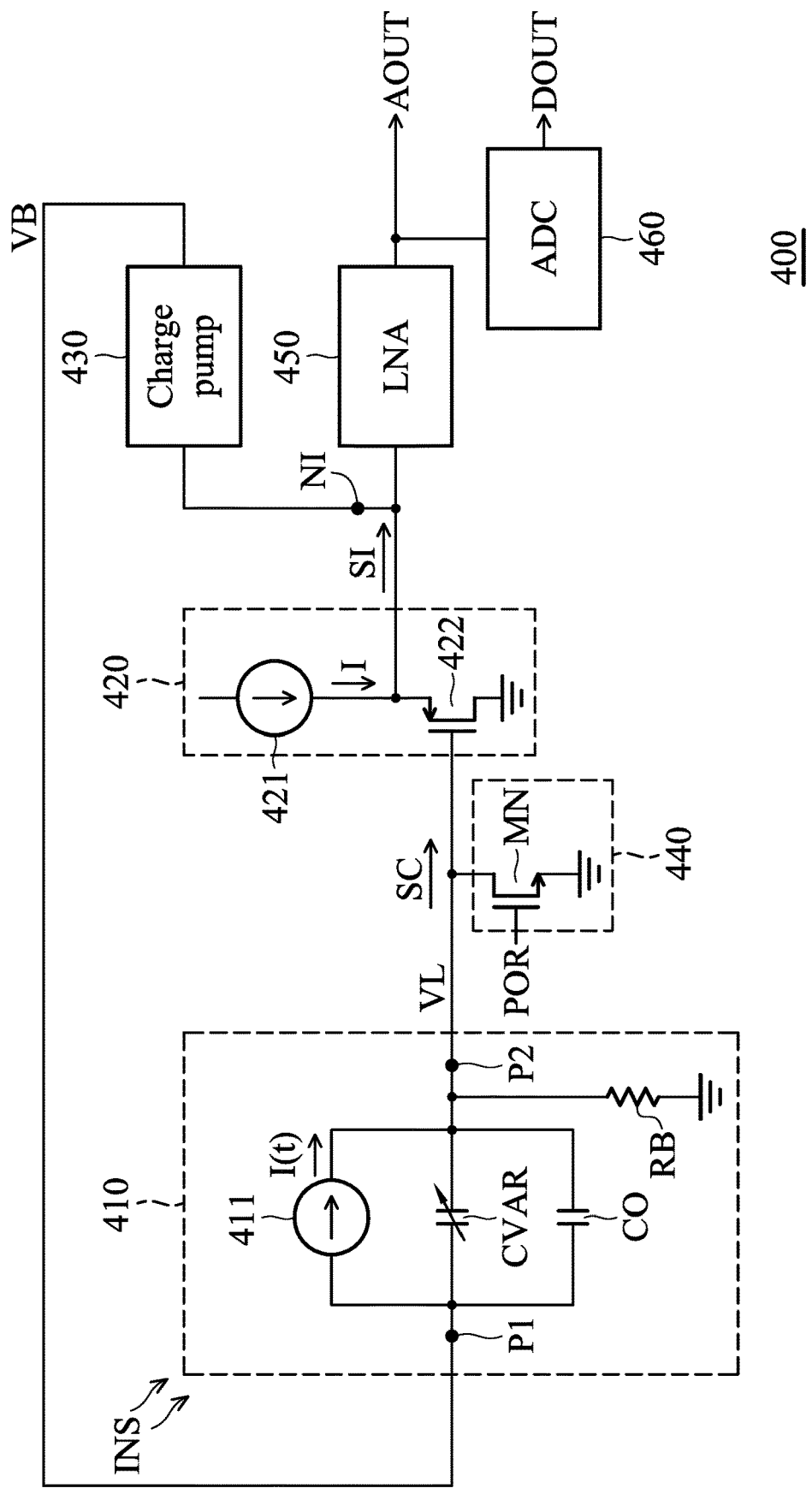
FIG. 4 is a schematic diagram of a microphone circuit in accordance with yet another embodiment of the invention.

FIG. 4 is a schematic diagram of a microphone circuit in accordance with yet another embodiment of the invention. As shown in FIG. 4, the microphone circuit 400 includes a transducer 410, a front-end buffer 420, a charge pump 430, a switch 440, a low-noise amplifier 450, and an analog-to-digital converter 460.

The transducer 410 is modeled by a leakage current source 411, a bias resistor RB, a fixed capacitor C0, and a variable capacitor CVAR. The leakage current 411 indicates a leakage current I(t), which is time dependent, caused by the leakage characteristics of the transducer 410, which eventually becomes a constant after a period from startup. According to an embodiment of the invention, the leakage current I(t) is eventually vanished. In addition, the leakage current I(t) and the bias resistor RB generate a leakage voltage VL at the second plate P2.

The fixed capacitor C0 is coupled between the first plate P1 and the second plate P2. The variable capacitor CVAR is also coupled between the first plate P1 and the second plate P2, and varied in response to the incident sound wave INS.

According to an embodiment of the invention, a sum of the fixed capacitor C0 and the variable capacitor CVAR is equal to the CMEMS in FIGS. 2 and 3. When the transducer 410 receives the incident sound wave INS, the capacitance of the variable capacitor CVAR is varied so that the voltage signal SC is generated at the second plate P2.

The front-end buffer 420 includes a bias current source 421 and a P-type transistor 422, in which the bias current source 421 supplies a bias current I to bias the P-type transistor 422. According to an embodiment of the invention, the front-end buffer 420 levels up the voltage signal SC to generate the internal signal SI.

The charge pump 430 boosts the internal signal SI into the boost voltage VB to bias the first plate P1. According to an embodiment of the invention, the charge pump 430 is implemented by the charge pump 230 in FIG. 2. According to another embodiment of the invention, the charge pump 430 is implemented by the charge pump 300 in FIG. 3. According to other embodiments of the invention, any number of stages could be inserted between the second unidirectionally conducting device UC2 and the output unidirectionally conducting device UCO.

According to an embodiment of the invention, the switch 440 is implemented by an N-type transistor MN which is controlled by a power-on-reset signal POR. The low-noise amplifier 450 amplifies the internal signal SI to generate an audio signal AOUT. The analog-to-digital converter 460 converts the analog signal AOUT into a digital signal DOUT.

According to an embodiment of the invention, when the microphone circuit 400 is starting up, the switch 440 is turned ON by the power-on-reset signal POR to discharge the second plate P2 to the ground, in which the power-on-reset signal POR is a pulse. During a period from startup, the time-variant leakage current I(t) and the bias resistor RB generate the leakage voltage VL at the second plate P2. According to another embodiment of the invention, when the incident sound wave is received during startup so that the voltage signal SI is thus generated, the voltage of the second plate P2 is equal to a sum of the voltage signal SI and the leakage voltage VL.

The front-end buffer 420 brings the leakage voltage VL to the internal signal SI, such that the internal signal SI is equal to a sum of the source-to-gate voltage of the P-type transistor 422 and the leakage voltage VL. The charge pump 430 then boosts the internal voltage SI into the boost voltage VB.

The charge pump 430 is illustrated with the charge pump 300 in FIG. 3 such that the boost voltage VB is boosted into a voltage of a sum of 2-fold high logic level and the internal signal SI minus the drop voltages of the first unidirectionally conducting device UC1, the second unidirectionally conducting device UC2, and the output unidirectionally conducting device UCO.

Since the first plate P1 is biased by the voltage of the sum of 2-fold high logic level and the internal signal SI, regardless the drop voltages of the unidirectionally conducting devices in the charge pump 430, and the second plate P2 is biased by the leakage voltage VL, the voltage across the transducer 410 is equal to a sum of 2-fold high logic level and the source-to-gate voltage of the P-type transistor 422 which is independent from the leakage voltage VL.

Since the time-variant leakage characteristics have been canceled from the voltage across the transducer 410, the microphone circuit 400 is suitable for any transducer having different leakage characteristics. In addition, the settle time of the microphone circuit 400 after startup should be shorter since the time-variant leakage characteristics are canceled out.

While the invention has been described by way of example and in terms of preferred embodiment, it is to be understood that the invention is not limited thereto. Those who are skilled in this technology can still make various alterations and modifications without departing from the scope and spirit of this invention. Therefore, the scope of the present invention shall be defined and protected by the following claims and their equivalents.

What is claimed is:

1. A circuit for biasing a transducer, wherein the transducer comprises a first plate and a second plate, comprising:
    a front-end buffer, generating an internal signal at an internal node in response to a voltage signal of the second plate, wherein the transducer receives the incident sound wave at the first plate to generate the voltage signal at the second plate, wherein the front-end buffer comprises:
        a bias current source, sourcing a current to the internal node; and
        a P-type transistor, comprising a gate terminal coupled to the second plate, a source terminal coupled to the internal node, and a drain coupled to a ground; and
    a charge pump, boosting the internal signal into a boost voltage at the first plate according to a first clock signal.

2. The circuit of claim 1, wherein the charge pump comprises:
    a first unidirectionally conducting device, unidirectionally providing the internal signal to a first pump node;
    a first capacitor, coupled between the first pump node and the first clock signal;

an output unidirectionally conducting device, unidirectionally providing a voltage of the first pump node to the first plate; and
an output capacitor, coupled between the first plate and the ground.

3. The circuit of claim 2, wherein the first clock signal comprises a high logic level and a low logic level, wherein the boost voltage is boosted to a level that is equal to a sum of the internal signal and the high logic level minus the drop voltages across the first unidirectionally conducting device and the output unidirectionally conducting device.

4. The circuit of claim 2, wherein each of the first unidirectionally conducting device and the output unidirectionally conducting device is a diode.

5. The circuit of claim 2, wherein each of the first unidirectionally conducting device and the output unidirectionally conducting device is a diode-connected transistor.

6. The circuit of claim 2, wherein the charge pump further comprises:
a second unidirectionally conducting device, coupled between the first pump node and the output unidirectionally conducting device and unidirectionally coupling the first pump node to a second pump node, wherein the output unidirectionally conducting device is coupled between the second pump node and the first plate; and
a second capacitor, coupled between the second pump node and a second clock signal, wherein the second clock signal is an inverse of the first clock signal.

7. The circuit of claim 6, wherein the second unidirectionally conducting device is a diode.

8. The circuit of claim 6, wherein second unidirectionally conducting device is a diode-connected transistor.

9. The circuit of claim 2, wherein the transducer comprises:
a leakage current source, comprising a leakage current flowing from the first plate to the second plate, wherein the leakage current is time-variant and is a constant after a period from startup;
a variable capacitor, coupled between the first plate and the second plate and comprising a capacitance, wherein the capacitance is varied in response to the incident sound wave;
a fixed capacitor, coupled between the first plate and the second plate; and
a bias resistor, coupled between the second plate and a ground.

10. The circuit of claim 9, further comprising:
a switch, coupled between the second plate and the ground and controlled by a power-on-reset signal, wherein when the circuit is powered ON and the switch pulls a voltage of the second plate to the ground, the leakage current and the bias resistor generates a leakage voltage at the second plate, wherein the charge pump boosts the leakage voltage into the boost voltage at the first plate, such that a voltage across the transducer is not related to the leakage voltage.

11. The circuit of claim 9, further comprising:
a low-noise amplifier, amplifying the internal signal to generate an audio signal; and
an analog-to-digital converter, converting the audio signal into a digital signal.

12. A microphone circuit, comprising:
a transducer, comprising a first plate and a second plate, wherein the transducer receives an incident sound wave at the first plate to generate a voltage signal at the second plate;

a front-end buffer, generating an internal signal at an internal node in response to the voltage signal, wherein the front-end buffer comprises:
a bias current source, sourcing a current to the internal node; and
a P-type transistor, comprising a gate terminal coupled to the second plate, a source terminal coupled to the internal node, and a drain coupled to a ground; and
a charge pump, boosting the internal signal into a boost voltage at the first plate according to a first clock signal.

13. The microphone circuit of claim 12, wherein the charge pump comprises:
a first unidirectionally conducting device, unidirectionally providing the internal signal to a first pump node;
a first capacitor, coupled between the first pump node and the first clock signal;
an output unidirectionally conducting device, unidirectionally providing a voltage of the first pump node to the first plate; and
an output capacitor, coupled between the first plate and the ground.

14. The microphone circuit of claim 13, wherein the first clock signal comprises a high logic level and a low logic level, wherein the boost voltage is boosted to a level that is equal to the sum of the internal signal and the high logic level minus the drop voltages across the first unidirectionally conducting device and the output unidirectionally conducting device.

15. The microphone circuit of claim 13, wherein each of the first unidirectionally conducting device and the output unidirectionally conducting device is a diode.

16. The microphone circuit of claim 13, wherein each of the first unidirectionally conducting device and the output unidirectionally conducting device is a diode-connected transistor.

17. The microphone circuit of claim 13, wherein the charge pump further comprises:
a second unidirectionally conducting device, coupled between the first pump node and the output unidirectionally conducting device and unidirectionally coupling the first pump node to a second pump node, wherein the output unidirectionally conducting device is coupled between the second pump node and the first plate; and
a second capacitor, coupled between the second pump node and a second clock signal, wherein the second clock signal is an inverse of the first clock signal.

18. The microphone circuit of claim 17, wherein the second unidirectionally conducting device is a diode.

19. The microphone circuit of claim 17, wherein the second unidirectionally conducting device is a diode-connected transistor.

20. The microphone circuit of claim 13, wherein the transducer comprises:
a leakage current source, comprising a leakage current flowing from the first plate to the second plate, wherein the leakage current is time-variant and is a constant after a period from startup;
a variable capacitor, coupled between the first plate and the second plate and comprising a capacitance, wherein the capacitance is varied in response to the incident sound wave;
a fixed capacitor, coupled between the first plate and the second plate; and
a bias resistor, coupled between the second plate to a ground.

21. The microphone circuit of claim 20, further comprising:
- a switch, coupled between the second plate and the ground and controlled by a power-on-reset signal, wherein when the circuit is powered ON and the switch pulls a voltage of the second plate to the ground, the leakage current and the bias resistor generates a leakage voltage at the second plate, wherein the charge pump boosts the leakage voltage into the boost voltage at the first plate, such that a voltage across the transducer is not related to the leakage voltage.

22. The microphone circuit of claim 20, further comprising:
- a low-noise amplifier, amplifying the internal signal to generate an audio signal; and
- an analog-to-digital converter, converting the audio signal into a digital signal.

* * * * *